US010617047B2

(12) United States Patent
Ilsaka

(10) Patent No.: US 10,617,047 B2
(45) Date of Patent: Apr. 7, 2020

(54) MOUNTING MANAGEMENT DEVICE

(71) Applicant: FUJI CORPORATION, Chiryu-shi (JP)

(72) Inventor: Jun Ilsaka, Nisshin (JP)

(73) Assignee: FUJI CORPORATION, Chiryu-shi (JP)

( * ) Notice: Subject to any disclaimer, the term of this patent is extended or adjusted under 35 U.S.C. 154(b) by 231 days.

(21) Appl. No.: 15/551,067

(22) PCT Filed: Feb. 16, 2015

(86) PCT No.: PCT/JP2015/054155
§ 371 (c)(1),
(2) Date: Aug. 15, 2017

(87) PCT Pub. No.: WO2016/132438
PCT Pub. Date: Aug. 25, 2016

(65) Prior Publication Data
US 2018/0064005 A1    Mar. 1, 2018

(51) Int. Cl.
*H05K 13/02*    (2006.01)
*H05K 13/04*    (2006.01)
*H05K 13/08*    (2006.01)

(52) U.S. Cl.
CPC .......... *H05K 13/02* (2013.01); *H05K 13/021* (2013.01); *H05K 13/0215* (2018.08);
(Continued)

(58) Field of Classification Search
CPC .. H05K 13/02; H05K 13/021; H05K 13/0215; H05K 13/0404; H05K 13/0417;
(Continued)

(56) References Cited

U.S. PATENT DOCUMENTS 5,268,059 A * 12/1993 Olson ................ H05K 13/0419
156/750
6,256,870 B1    7/2001 Asai et al.
(Continued)

FOREIGN PATENT DOCUMENTS

JP    11-70485 A    3/1999
JP    2000-332489 A    11/2000
(Continued)

OTHER PUBLICATIONS

Machine Language Translation (English) of Japanese Publication, JP 2013-051240, May 2019.*
(Continued)

*Primary Examiner* — A. Dexter Tugbang
(74) *Attorney, Agent, or Firm* — Oblon, McClelland, Maier & Neustadt, L.L.P.

(57) ABSTRACT

Multiple tape feeders are installed in one row on a feeder setting base of a component mounting apparatus. The tape feeder is a variable tape feeder that is displaceable in a tape width direction to a predetermined displacement amount with respect to a feeder main body in which a reel holder has a wider width than the feeder main body. A mounting management device is a device that performs management of the component mounting apparatus, and sets an installation position considering an amount of displacement of the tape feeder such that the adjacent tape feeders do not interfere with each other.

5 Claims, 13 Drawing Sheets

(52) U.S. Cl.
CPC ..... *H05K 13/0404* (2013.01); *H05K 13/0417* (2013.01); *H05K 13/0419* (2018.08); *H05K 13/085* (2018.08); *Y10T 29/53174* (2015.01); *Y10T 29/53261* (2015.01); *Y10T 29/53478* (2015.01)

(58) Field of Classification Search
CPC .............. H05K 13/0419; H05K 13/085; Y10T 29/53171; Y10T 29/53261; Y10T 29/53478; Y10T 29/53174
See application file for complete search history.

(56) References Cited

U.S. PATENT DOCUMENTS

2001/0018798 A1    9/2001   Asai et al.
2007/0130756 A1*   6/2007   Watanabe .......... H05K 13/0215
                                                29/743

FOREIGN PATENT DOCUMENTS

| JP | 2005-216945 A | | 8/2005 | |
|---|---|---|---|---|
| JP | 2008-85141 A | | 4/2008 | |
| JP | 2011-66128 A | | 3/2011 | |
| JP | 2013-51240 A | | 3/2013 | |
| JP | 2013247311 A | * | 12/2013 | ......... H05K 13/0417 |

OTHER PUBLICATIONS

Machine Language Translation (English) of Japanese Publication, JP 2011-066128, May 2019.*
Extended European Search Report dated Sep. 4, 2018 in Patent Application No. 15882542.2.
Office Action dated Jan. 30, 2018 in Japanese Patent Application No. 2017-500157 (with unedited computer generated English translation) 6 pages.
International Search Report dated May 19, 2015 in PCT/JP2015/054155 filed Feb. 16, 2015.

* cited by examiner

MOUNTING MANAGEMENT DEVICE

TECHNICAL FIELD

The present application relates to a mounting management device.

BACKGROUND ART

A component mounting apparatus which picks up and mounts a component on a board using a nozzle of a component pick-up head from a component supply tape that is fed out to a component supply position is known in the related art. Here, the component supply tape is supplied to the component supply position by a tape feeder. The tape feeder is provided with a reel holding section that holds to be rotatable a reel around which the component supply tape is wound and a feeder section that feeds out the component supply tape that is unwound from the reel to the component supply position. The component mounting apparatus has a feeder setting base on which multiple slots into which tape feeders are installable are lined up in one row. A device that calculates an alignment order of tape feeders that are lined up on the feeder setting base such that movement time or movement distance of the component pick-up head is optimized when the component is mounted on one board is known as such a component mounting apparatus (for example, PTL 1).

CITATION LIST

Patent Literature

PTL 1: JP-A 2013-51240

SUMMARY

However, a variable tape feeder that is displaceable in a tape width direction with respect to the feeder section in which a width of a reel holding section is wider than that of a feeder section is not known up until now as a tape feeder. Therefore, in what manner multiple tape feeders that include the variable tape feeder are installed in the slots of a feeder setting base has not been investigated up until now.

The present disclosure is carried out in order to solve such a problem, and has the main object of appropriately performing setting of in what manner multiple tape feeders that include the variable tape feeder are installed in the slots of a feeder setting base.

Solution to Problem

A mounting management device of the present disclosure managing a component mounting apparatus which includes component mounting means for picking up and mounting a component on a board using a nozzle from a component supply tape that is fed out to a component supply position, a tape feeder that has a reel holding section that holds to be rotatable a reel around which the component supply tape is wound and a feeder section that feeds out the component supply tape that is unwound from the reel to the component supply position, and a feeder setting base on which multiple slots into which the tape feeders are installable are lined up in one row, the mounting management device is provided with: installation position setting means for setting the multiple tape feeders having the same or different width which are installed on any slot of the feeder setting base, in which at least one of the multiple tape feeders of the component mounting apparatus is a variable tape feeder that is displaceable in a tape width direction to a predetermined displacement amount with respect to the feeder section in which a width of the reel holding section is wider than that of the feeder section, and the installation position setting means sets an installation position considering the amount of displacement of the variable tape feeder such that the adjacent tape feeders do not interfere with each other in a case where at least one of the adjacent tape feeders is the variable tape feeder.

In the component mounting apparatus that is managed by the mounting management device, at least one of the multiple tape feeders is a variable tape feeder that is displaceable in a tape width direction to a predetermined displacement amount with respect to the feeder section in which a reel holding section is wider than the feeder section. The mounting management device sets in which slot of the feeder setting base the multiple tape feeders that have the same or different width are installed. At that time, the installation position is set considering the displacement amount of the variable tape feeder such that the adjacent tape feeders do not interfere with each other in a case where at least one of the adjacent tape feeders is the variable tape feeder. Therefore, it is possible to avoid interference by considering the displacement amount even in a case where variable tape feeders and an adjacent tape feeder interfere, if, for example, the displacement amount is considered. Accordingly, according to the mounting management device of the present disclosure, it is possible to appropriately perform setting of in what manner multiple tape feeders that include the variable tape feeder are installed in the slots of a feeder setting base.

In the mounting management device of the present disclosure, the installation position setting means may set the installation position such that a clearance between the reel holding sections of the adjacent tape feeders is as narrow as possible. By doing so, it is possible to increase the number of installed tape feeders.

In the mounting management device of the present disclosure, the installation position setting means may, in a case where at least one of the adjacent tape feeders is the variable tape feeder, determine whether or not the reel holding sections interfere with each other without displacement in a state where a temporary installation position is set such that the feeder sections of the adjacent tape feeders do not interfere with each other, if there is no interference, set the temporary installation position as the installation position, if there is interference, determine whether or not it is possible to avoid interference by displacing the reel holding section of the variable tape feeder by setting the displacement amount as an upper limit, if it is possible to avoid interference, set the temporary installation position as the installation position, and if it is not possible to avoid interference, update the temporary installation position of each tape feeder such that a gap between both positions is wide. By doing so, it is possible, as appropriate, to comparatively easily perform setting of the installation position.

Here, initially, the installation position setting means may set the temporary installation position of each tape feeder, and set the feeder sections of the adjacent tape feeders as close as possible in a range without interfering with each other. By doing so, it is possible to set the width (entire width) that all tape feeders on the feeder setting base occupy as narrow as possible.

In addition, the installation position setting means may modify the number and/or combination of the tape feeders that are set to be installed on the feeder setting base if it is not possible in the configuration of the feeder setting base to update the temporary installation position of the adjacent tape feeders such that the gap between both of the positions is wide. By doing so, the likelihood that it is possible to install after modifying increases since the number and/or combination of the tape feeders that are set to be installed on the feeder setting base is modified in a case where it is not possible to install all tape feeders to be installed on the feeder setting base.

DESCRIPTION OF EMBODIMENTS

Figure 1:
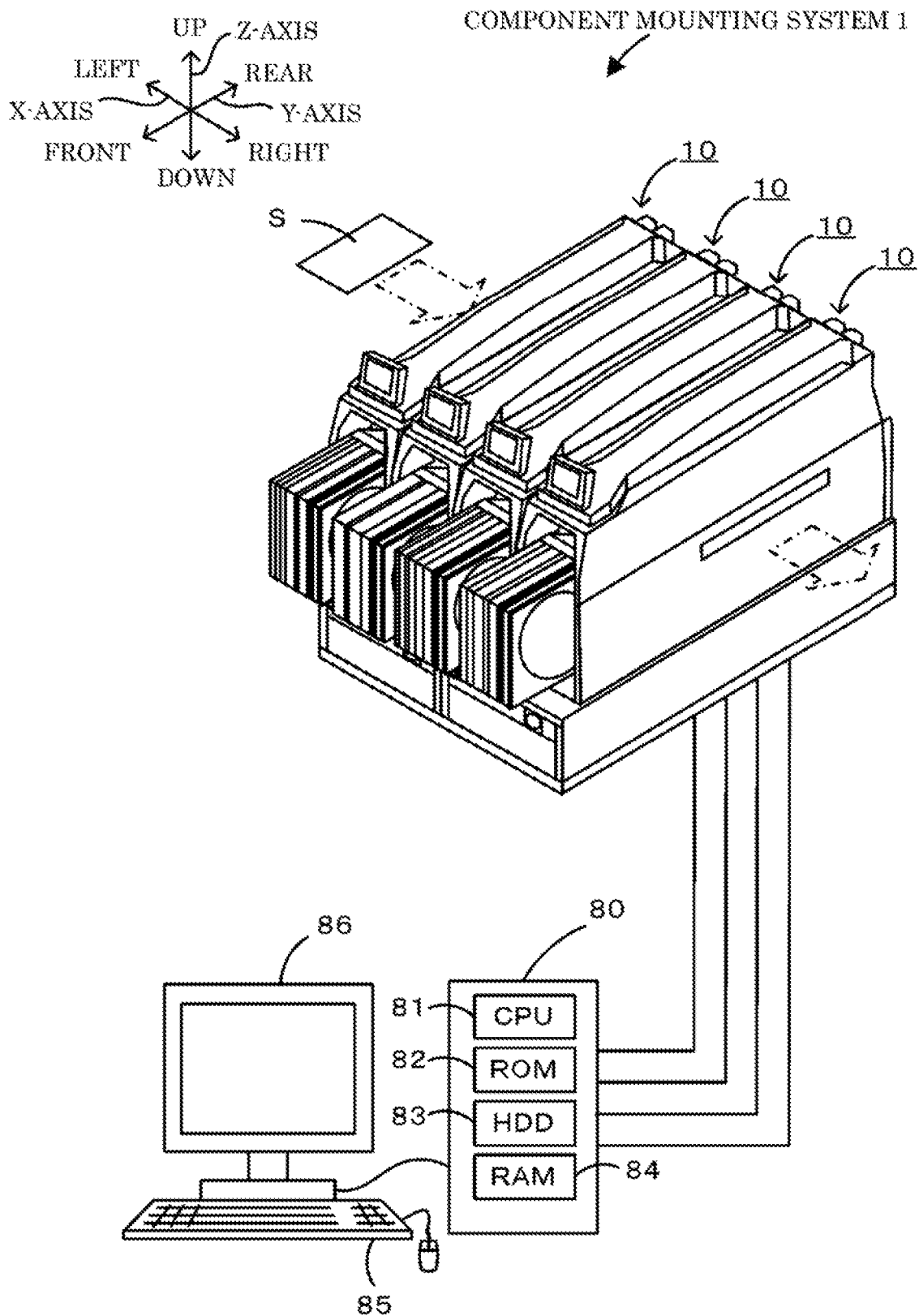
FIG. 1 is a schematic explanatory diagram of a component mounting system 1.
Figure 2:
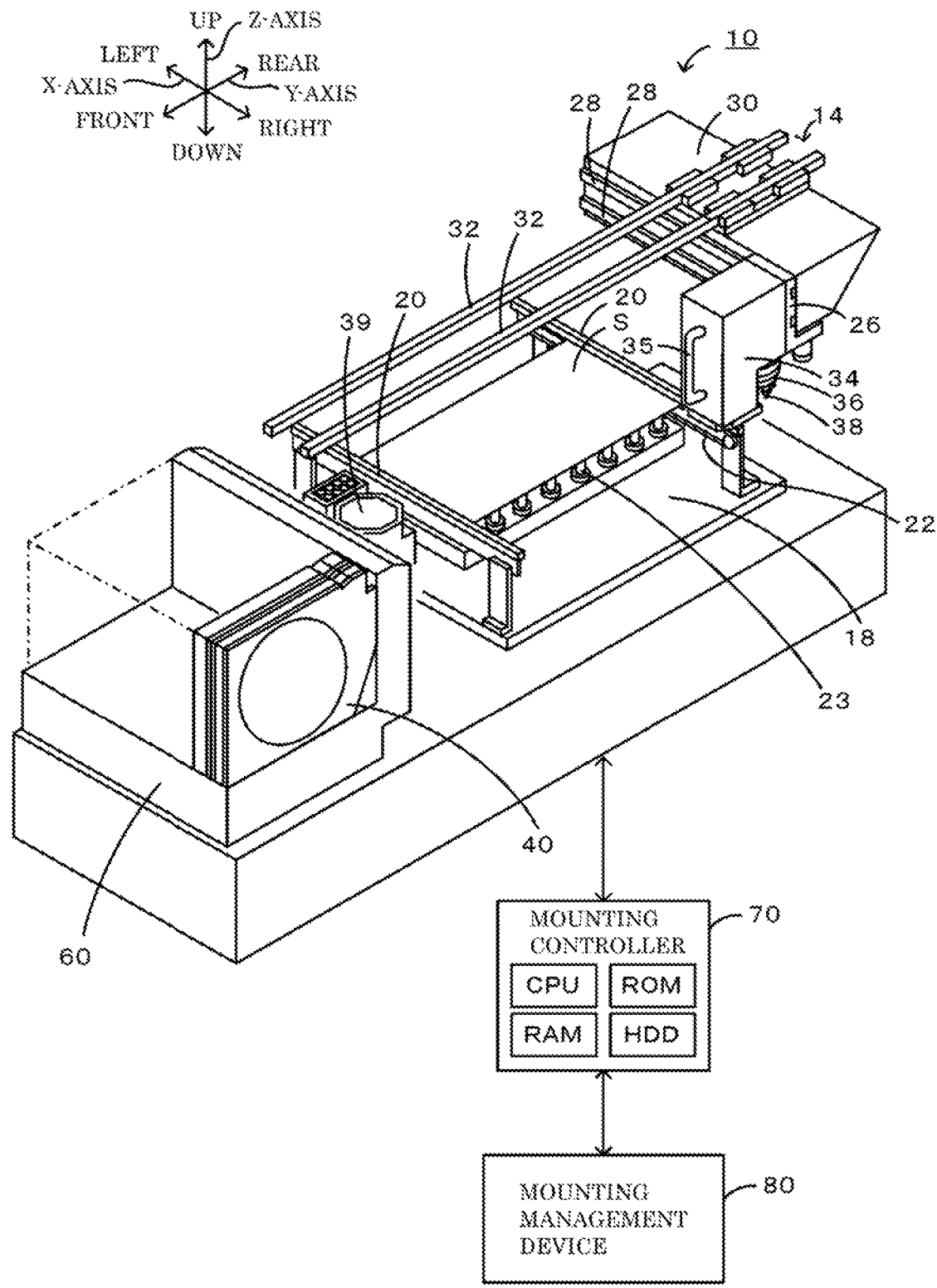
FIG. 2 is a perspective view of a component mounting apparatus 10.
Figure 3:
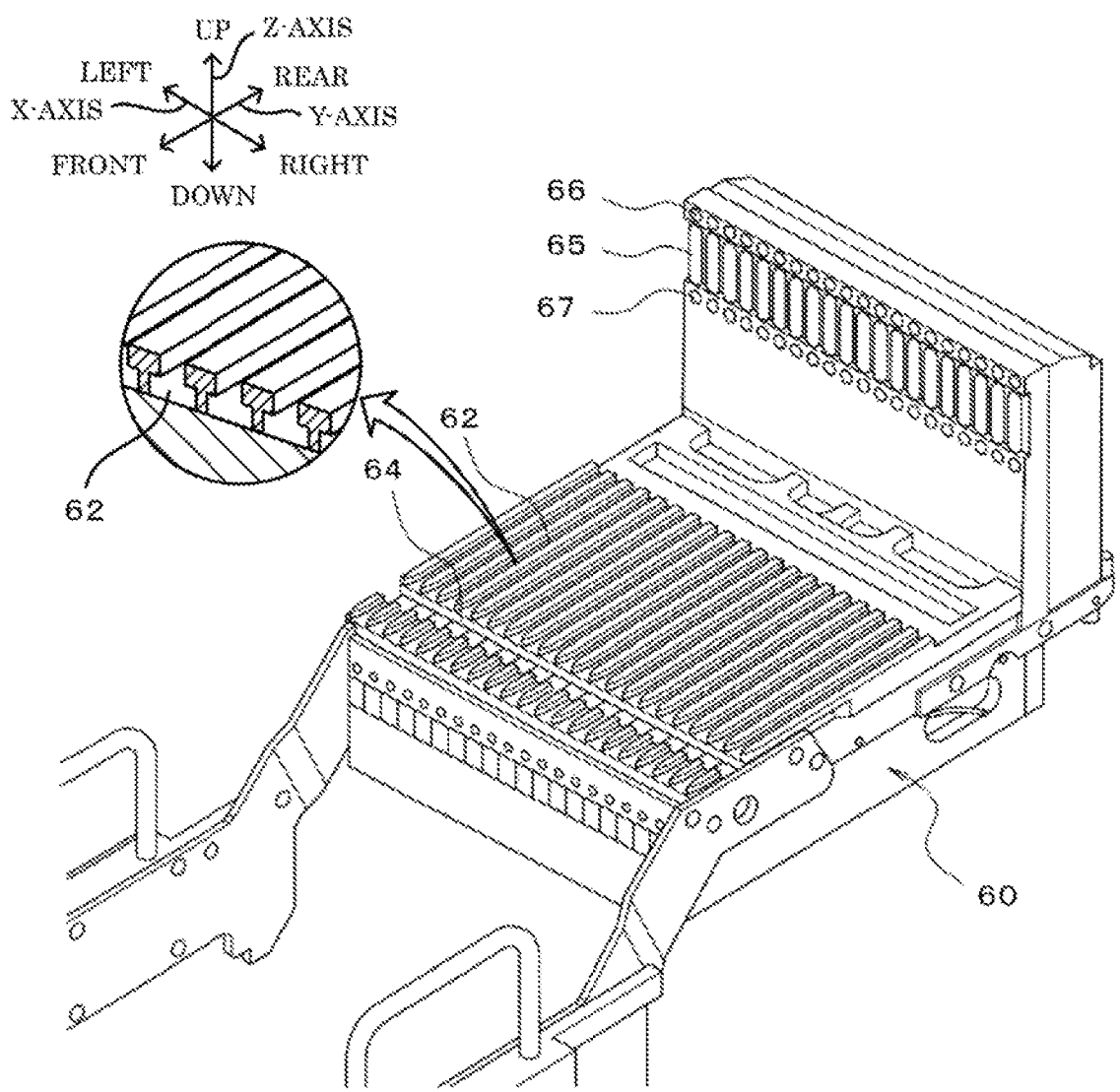
FIG. 3 is a perspective view of a feeder setting base 60.
Figure 4:
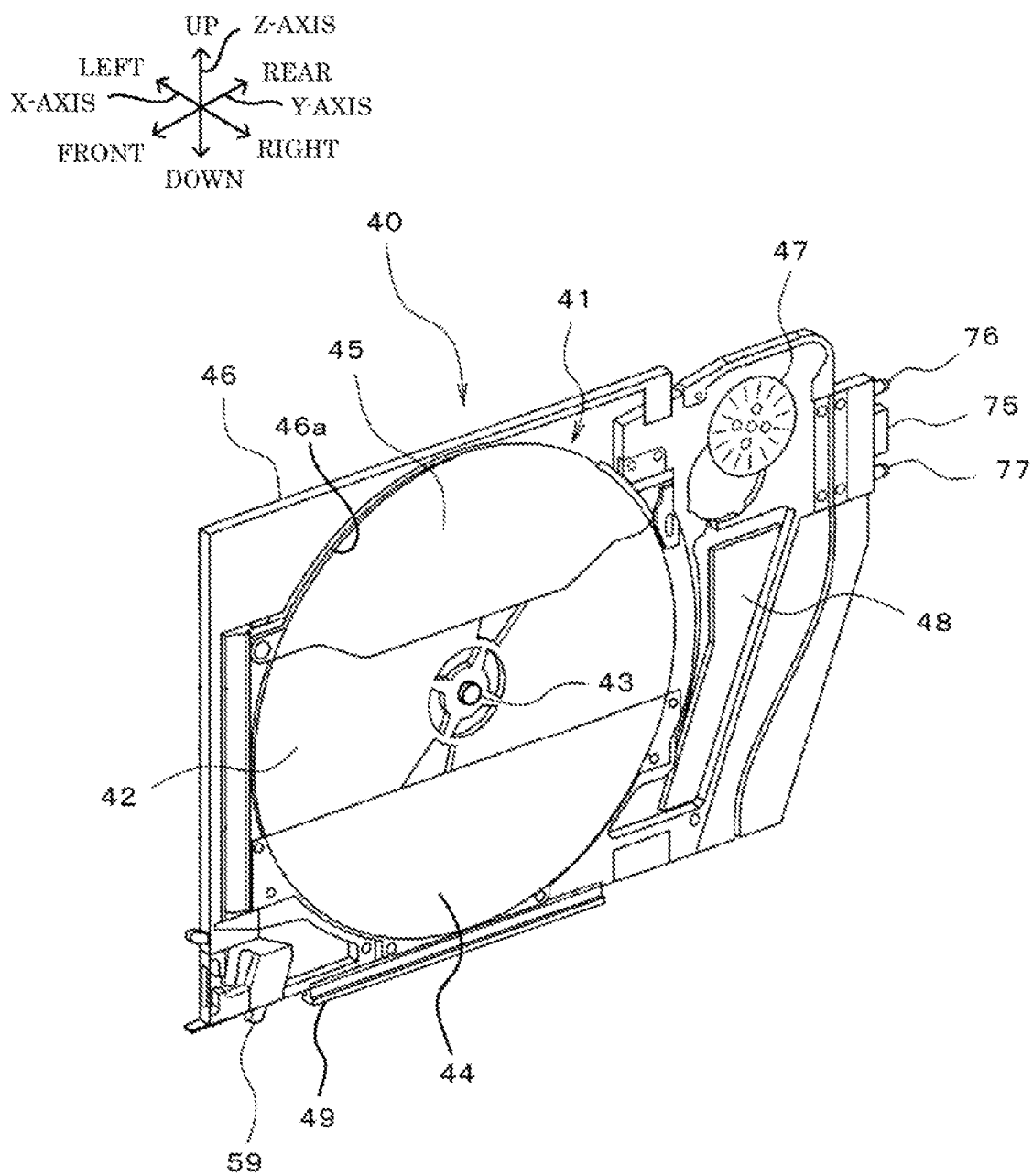
FIG. 4 is a perspective view of a tape feeder 40.
Figure 5:
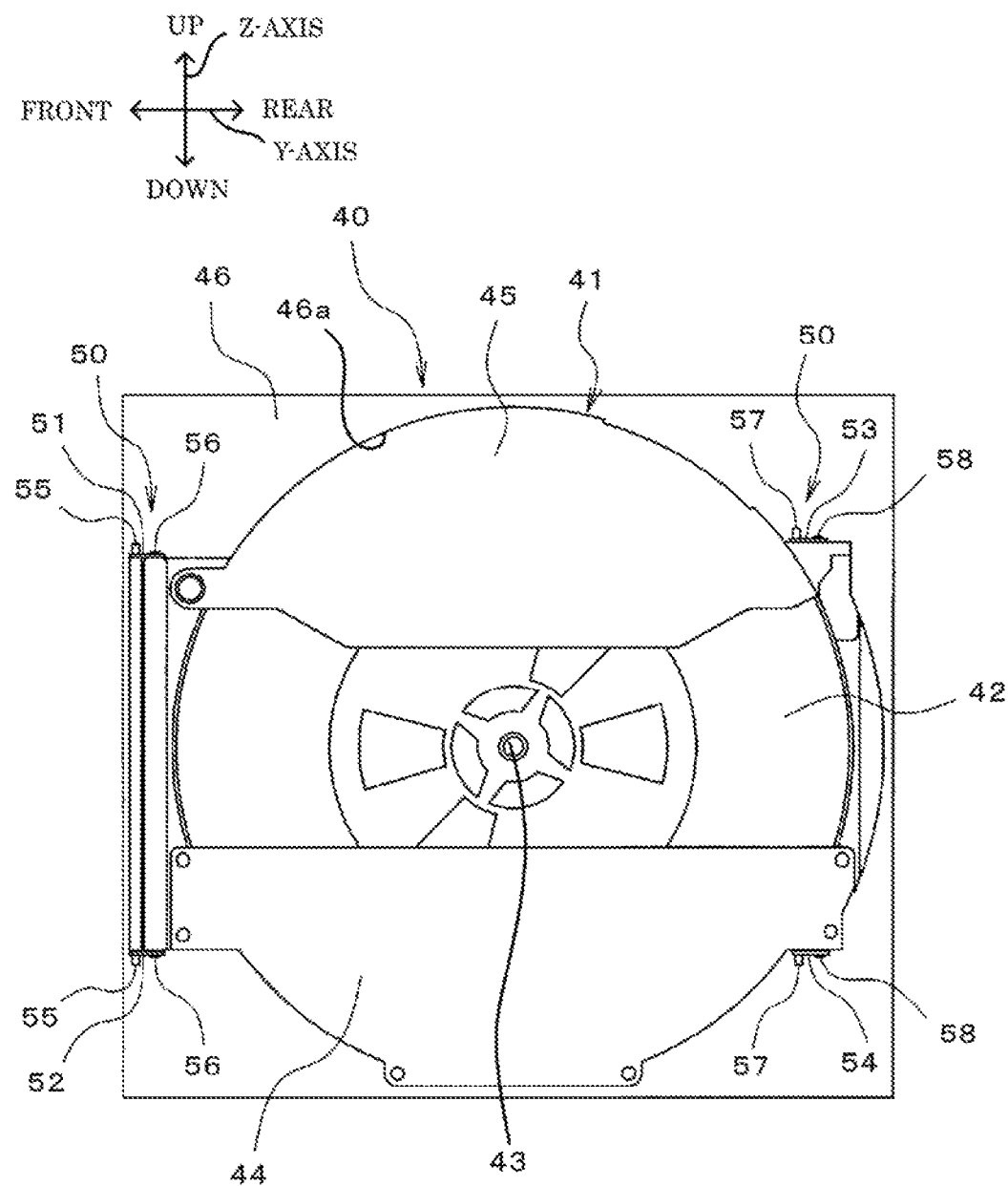
FIG. 5 is a front view of a peripheral part of a reel holder 41 of the tape feeder 40.
Figure 6:
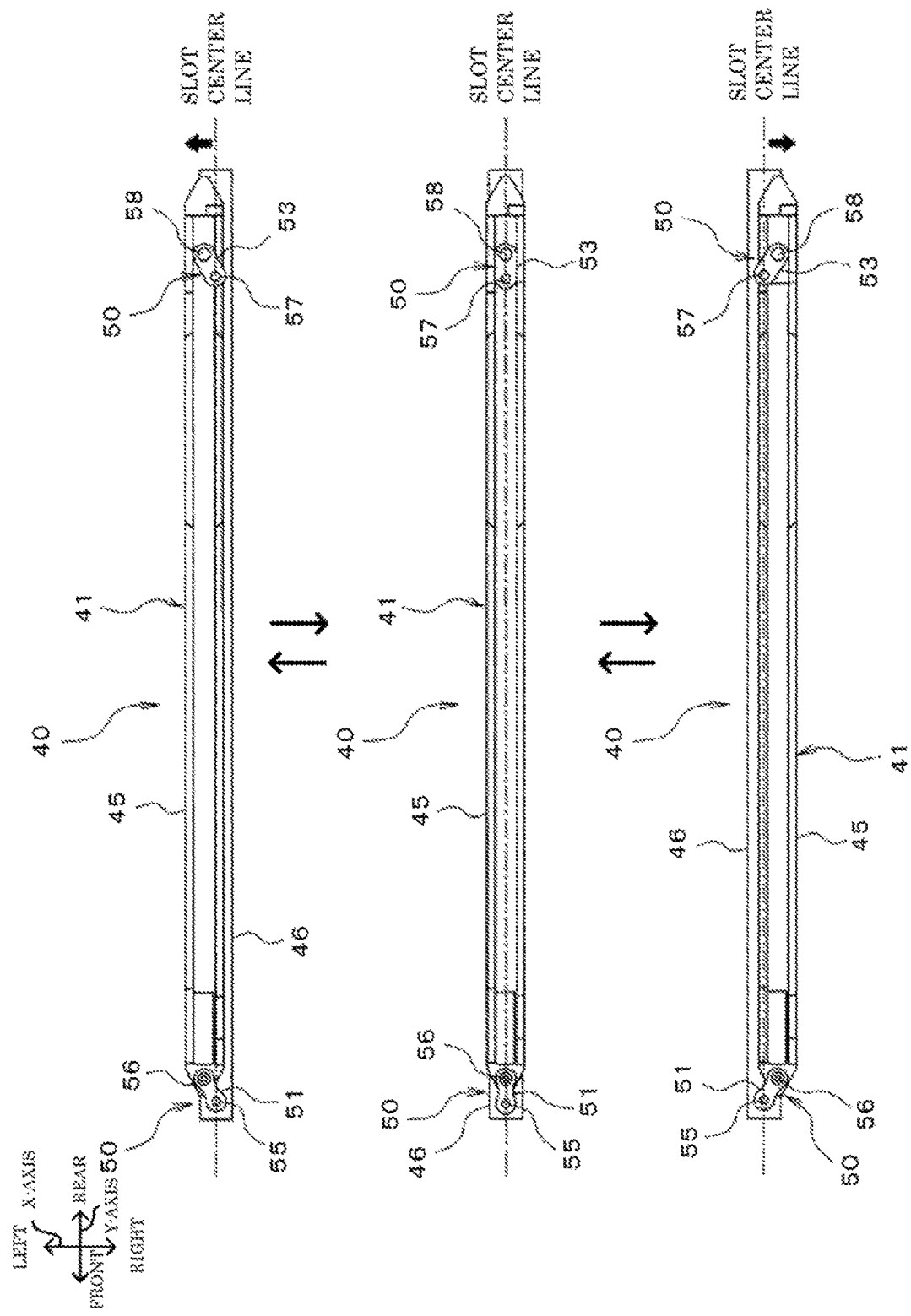
FIG. 6 is an explanatory diagram illustrating a circumstance in which the reel holder 41 is displaced with respect to a feeder main body 46.

Appropriate embodiments of the present disclosure are described below with reference to the drawings. FIG. 1 is a schematic explanatory diagram of a component mounting system 1, FIG. 2 is a perspective view of a component mounting apparatus 10, FIG. 3 is a perspective view of a feeder setting base 60, FIG. 4 is a perspective view of a tape feeder 40, FIG. 5 is a front view of a peripheral part of a reel holder 41 of the tape feeder 40, and FIG. 6 is an explanatory diagram illustrating a circumstance in which a reel holder 41 is displaced with respect to a feeder main body 46. Here, in the present embodiment, a left-right direction (X-axis), a front-back direction (Y-axis), and an up-down direction (Z-axis) are as indicated in FIGS. 1 to 6.

As shown in FIG. 1, the component mounting system 1 is provided with multiple component mounting apparatuses 10 that form a mounting line and a mounting management device 80 that manages production of a board. In the component mounting system 1, each component mounting apparatus 10 performs mounting of the component with respect to a board S that is loaded from an upstream side and the board S is carried out after the component is mounted.

As shown in FIG. 2, the component mounting apparatus 10 is provided with a component mounting machine 14 (component mounting means), a tape feeder 40, a feeder setting base 60, and a mounting controller 70.

The component mounting machine 14 is provided with a board conveyance device 18 that conveys the board S, a head unit 34 that is movable on the XY-plane, and a parts camera 39 that images a component that is moved by a suction nozzle 38 of the head unit 34.

The board conveyance device 18 is provided with supporting boards 20 and 20 that extend in a left-right direction provided with a gap open to the front and rear in FIG. 2 and conveyor belts 22 and 22 that are provided on surfaces that face each of the supporting boards 20 and 20 (only one is illustrated in FIG. 1). The conveyor belts 22 and 22 span such that a drive wheel and a driven wheel that are provided on the left and right of the supporting boards 20 and 20 are in an endless state. The board S rides on an upper face of the pair of conveyor belts 22 and 22 and is conveyed from the left side to the right side. The board S is supported by multiple support pins 23 that are erected on a rear face side.

The head unit 34 is attached to be attachable and detachable to a front face of an X-axis slider 26. The head unit 34 has a handle 35 on a front face for an operator to grasp during exchange work. The X-axis slider 26 is slidably attached to a pair of upper and lower guide rails 28 and 28 that extend in the left-right direction provided on the front face of a Y-axis slider 30. The Y-axis slider 30 is slidably attached to the pair of left and right guide rails 32 and 32 that extend in the front-back direction. In the head unit 34, the X-axis slider 26 moves in the left-right direction accompanying movement in the left-right direction, and the Y-axis slider 30 moves in the front-back direction accompanying movement in the front-back direction. Note that, each slider 26 and 30 is driven by respective driving motors (not shown in the drawings). The head unit 34 has a rotary head 36 which is provided with multiple suction nozzles 38. The suction nozzle 38 sucks a component to the tip of the nozzle utilizing pressure, and releases the component which is sucked by the nozzle tip. It is possible to adjust the height of the suction nozzle 38 using a Z-axis motor, which is not shown in the drawings, that is installed on the head unit 34. The suction nozzle 38 is appropriately exchanged according to the type, size, and the like of the component.

The parts camera 39 is installed such that the imaging direction is an upper orientation approximately in the center of a length in the left-right direction between the feeder setting base 60 and the board conveyance device 18. The parts camera 39 captures the component that is sucked by the suction nozzle 38 which passes upward, and outputs the image that is obtained by capturing to the mounting controller 70.

As shown in FIGS. 4 to 6, the tape feeder 40 is provided with the reel holder 41 (reel holding section), the feeder main body 46 (feeder section), and a link mechanism 50. The tape feeder 40 is a variable tape feeder that is displaceable in a left-right direction to a predetermined displacement amount with respect to the feeder main body 46 in which a width of the reel holder 41 is wider than that of the feeder main body 46.

The reel holder 41 is provided with a reel holding shaft 43 that holds, to be rotatable, a tape reel 42 around which the component supply tape is wound, a lower cover 44 that covers a lower portion of the tape reel 42, and an upper cover 45 that covers an upper portion of the tape reel 42. The component is held along a longitudinal direction on a surface of the component supply tape. The component is protected by a top film that covers the surface of the component supply tape.

The feeder main body 46 has a flat shaped case, and supports the reel holder 41 that holds the tape reel 42 to be displaceable along a width direction (left-right direction), that is, X-axis of the feeder main body 46 via the link mechanism 50. Therefore, a hole 46a that it is possible for the reel holder 41 to pass through in the width direction is open to the feeder main body 46. The feeder main body 46 is provided with a sprocket 47 that feeds out the component supply tape that is unwound from the tape reel 42 to a component suction position. In addition, the feeder main body 46 is provided with a top film peeling mechanism (not shown in the drawings) that exposes the component in the component supply tape by peeling the top film from the component supply tape in front of the component suction position. The component suction position is set close to the end portion on the tape feeding direction side on the upper face of the feeder main body 46. In the component supply tape that is fed out to the component supply position, the component is exposed by peeling the top film and the component supply tape is in a state of capable of being sucked by the suction nozzle 38. The feeder main body 46 is provided with a control board 48. The control board 48 controls a motor that rotatably drives the sprocket 47, a motor of the top film peeling mechanism, and the like. A rail 49 with a cross-sectional inverted T-shape is provided on the lower face of the feeder main body 46 and a clamp member 59 is elastically supported so as to protrude from the lower face further to the front side than the rail 49.

The width of the feeder main body 46 and the width of the reel holder 41 are set according to the width of the component supply tape (tape width) that is wound on the tape reel 42, and the tape width is set according to the size of the component. The width of the feeder main body 46 is set so as to be slightly larger than the tape width, but here for convenience, is described to be the same as the tape width. The width of the reel holder 41 is set so as to be larger than the width of the tape reel 42 if there is a relationship in which the tape reel 42 is larger than the tape width. For example, the width of the feeder main body 46 is 8 mm and the width of the reel holder 41 is 14.5 mm in a case where the tape width is 8 mm. The width of the feeder main body 46 is 16 mm and the width of the reel holder 41 is 23.5 mm in a case where the tape width is 16 mm.

The link mechanism 50 is a mechanism that holds the reel holder 41 to be displaceable in the width direction of the feeder main body 46. The link mechanism 50 is provided with swing links 51 to 54, a front main body shaft 55, a front holder shaft 56, a rear main body shaft 57, and a rear holder shaft 58. Respectively, respective one ends of the swing links 51 and 52 of the front upper side and the front lower side are swingably supported on the front main body shaft 55 that is provided in the feeder main body 46 and the other ends are swingably supported on the front holder shaft 56 that is provided in the reel holder 41. In addition, respective one ends of the swing links 53 and 54 of the rear upper side and the rear lower side are swingably supported on the rear main body shaft 57 that is provided in the feeder main body 46 and the other ends are swingably supported on the rear holder shaft 58 that is provided in the reel holder 41. The reel holder 41 on which the tape reel 42 is held is displaceable in the width direction of the feeder main body 46 accompanying displacement of the swing links 51 to 54 in the width direction with the front main body shaft 55 and the rear main body shaft 57 as support points. The circumstance in which the reel holder 41 is displaced is indicated in FIG. 6.

The feeder setting base 60 has multiple slots 62 on the upper face. The multiple slots 62 are provided in one row on the upper face of the feeder setting base 60 along the X-axis. The slots 62 have a cross-sectional inverted T-shaped groove (refer to partial sectional view in the circle in FIG. 3) and the cross-sectional inverted T-shape rail 49 that is provided on the lower face of the tape feeder 40 is inserted into the slots 62. The clamp grooves 64 are provided in the middle of the slots 62. The clamp member 59 that is provided on the lower face of the tape feeder 40 is fitted into the clamp groove 64 when the rail 49 with the cross-sectional inverted T-shape of the tape feeder 40 is inserted from the front to the rear of the slots 62. Thereby, the tape feeder 40 is supported in a state of being vertically placed in the slot 62 and the position in the front-back direction is determined according to the clamp member 59 and the clamp groove 64. The feeder setting base 60 has a standing wall on the tail end. On the standing wall, a connector 65 is provided at a position that corresponds to each slot 62 and positioning holes 66 and 67 are provided above and below each connector 65. As previously described, in a state in which the tape feeder 40 is inserted in the slot 62 and the clamp member 59 is fitted into the clamp groove 64, two positioning pins 76 and 77 that are provided on the tail end surface of the tape feeder 40 are inserted into the positioning holes 66 and 67, and the connector 75 that is provided between the two positioning pins 76 and 77 is electrically connected to the connector 65 of the feeder setting base 60. Thereby, the control board 48 and the mounting controller 70 of the tape feeder 40 are able to communicate bidirectionally.

Figure 7:
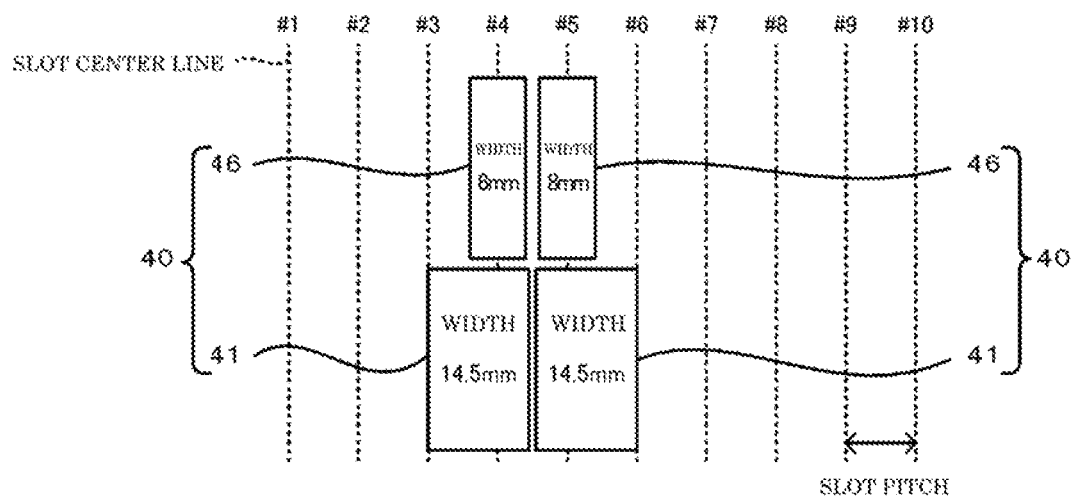
FIG. 7 is an explanatory diagram of when two tape feeders 40 are installed lined up.
Figure 8:
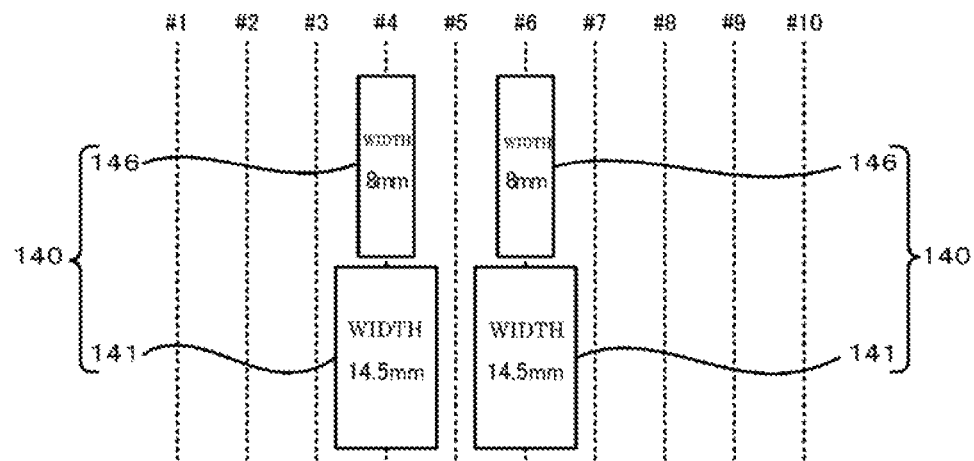
FIG. 8 is an explanatory diagram of when two tape feeders 140 are installed lined up.

Here, the installation position of the tape feeder 40 is described using FIGS. 7 and 8. In the present embodiment, for convenience of description, the gap (slot pitch) between center lines of the slot 62 is described as 10 mm. The slot 62 of the feeder setting base 60 is referred to as #1 slot, #2 slot, ... from left to right. Here, description is made using FIG. 7 in a case where two tape feeders 40 where the width of the feeder main body 46 is 8 mm and the width of the reel holder 41 is 14.5 mm are adjacent and inserted into the slot 62. Now there is a state in which one tape feeder 40 is already inserted into #4 slot. In this state, the reel holder 41 of #4 slot is displaced in the left direction with respect to the feeder main body 46 and the reel holder 41 of #5 slot is displaced in the right direction with respect to the feeder main body 46 in a case where another tape feeder 40 is inserted into the adjacent #5 slot. Therefore, it is possible to install the tape feeder 40 in #5 slot. Meanwhile, as shown in FIG. 8, in a case of the tape feeder 140 that it is not possible for a reel holder 141 to displace in the width direction with respect to a feeder main body 146, installation is not possible in #4 slot and #5 slot since there is interference therebetween even if the tape feeder 140 is lined up in #4 slot and #5 slot. Therefore, it is not possible to install the tape feeder 140 in #4 slot and #6 slot. In this manner, if the reel holder 41 utilizes the tape feeder 40 that is displaceable in the width direction with respect to the feeder main body 46, it is possible to install the same number of tape feeders 40 in slot 62 of the feeder setting base 60 by plugging a gap. Accordingly, it is possible to increase the number of tape feeders 40 that are installable on the feeder setting base 60, and thus, it is anticipated that the number of component mounting apparatuses 10 that constitute the component mounting system 1 is reduced.

As shown in FIG. 2, the mounting controller 70 is configured as a microprocessor with a CPU as the center, and is provided with a ROM that stores a processing program, an HDD that stores various data, a RAM that is used as a work region, and the like. These components are electrically connected via a bus which is not shown in the drawings. The mounting controller 70 is connected to the control board 48 or the mounting management device 80 of the tape feeder 40 such that bidirectional communication is possible. In addition, the mounting controller 70 is connected such that it is possible to output the control signal to the board conveyance device 18, the X-axis slider 26, the Y-axis slider 30, a Z-axis motor, or the like, and is connected to be able to receive an image from the parts camera 39. For example, the mounting controller 70 controls the board conveyance device 18, the X-axis slider 26, the Y-axis slider 30, the Z-axis motor, or the like so as to be sequentially mounted at predetermined positions on the board S by picking up the component from the component supply tape that is fed out to the component supply position by each tape feeder 40 using the suction nozzle 38 based on the production program that is received from the mounting management device 80. In addition, the mounting controller 70 determines whether or not the component is sucked by the suction nozzle 38 or determines the shape, size, suction position, and the like of the component based on the image that is captured by the parts camera 39.

As shown in FIG. 1, the mounting management device 80 is a microprocessor with a CPU 81 as the center, and is provided with a ROM 82 that stores a processing program, an HDD 83 that stores the production program and the like of the board, a RAM 84 that is used as a work region, and the like. These components are electrically connected via a bus which is not shown in the drawings. The mounting management device 80 inputs an input signal from an input device 85 such as a mouse or a keyboard, and from the mounting management device 80 outputs the image signal to a display 86.

Figure 9:
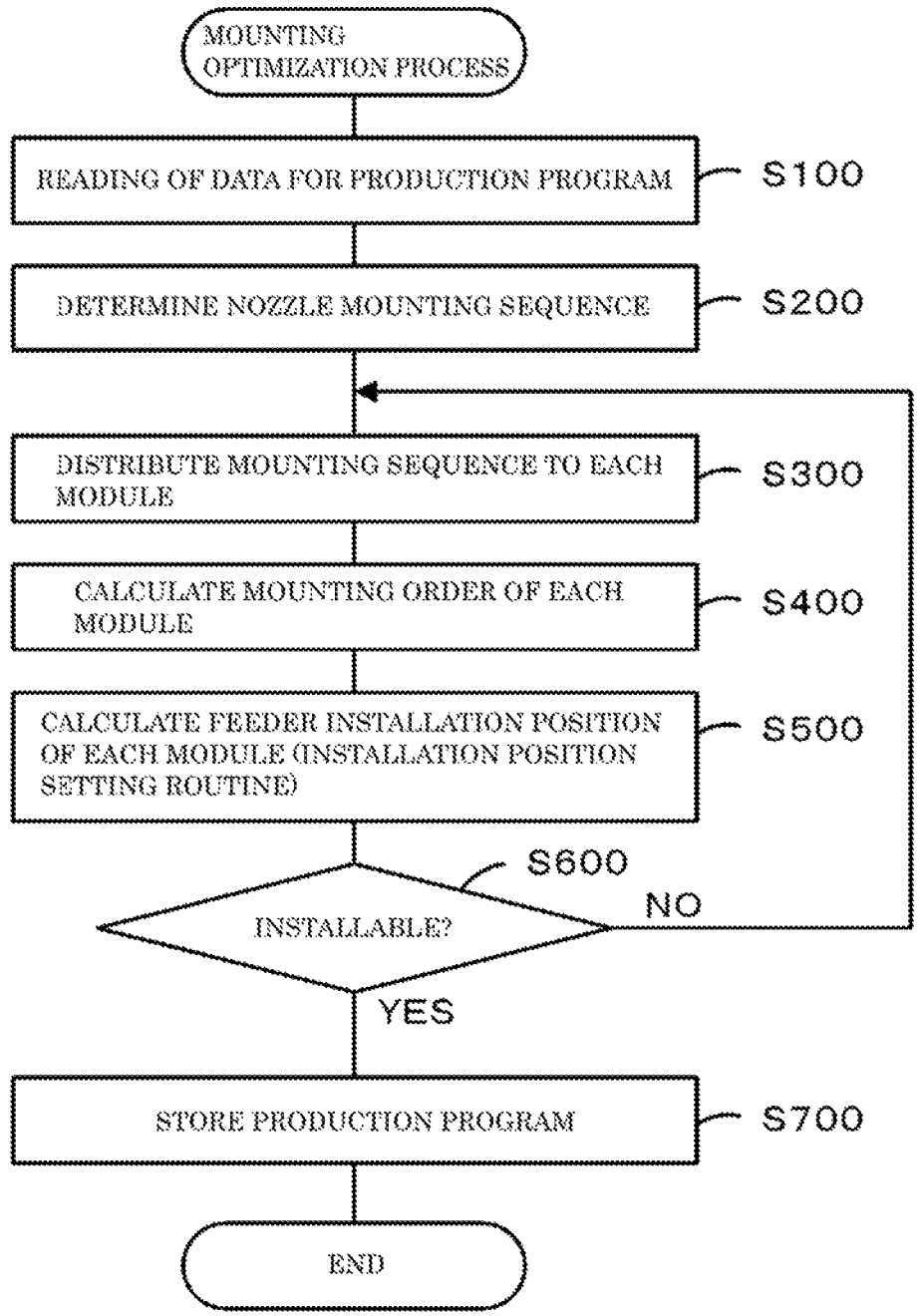
FIG. 9 is a flowchart of a mounting optimization process routine.

Next, a mounting optimization process routine will be described that is performed by the mounting management device 80 of the component mounting system 1 that is constituted in this manner. FIG. 9 is a flowchart of the mounting optimization process routine.

When the mounting optimization process routine is started, the CPU 81 of the mounting management device 80 reads data for the current production program from the HDD (step S100). The production program is a program which relates to a plan that determines what kind of component is mounted on the board, how many boards on which the components are mounted are produced, and the like. The production program is stored on the HDD of the mounting management device 80 by the operator operating the input device 85. Data for the production program is component information which relates to the production time, number of boards produced, and the component that is mounted on the board, head information which relates to the head that is used, nozzle information which relates to the suction nozzle 38 that is mounted in the head, and the like.

Next, the CPU 81 of the mounting management device 80 sets the mounting sequence (step S200). Specifically, the CPU 81 sets the mounting sequence by designating the component type, the mounting position (X-coordinate and Y-coordinate), and the type of suction nozzle that is used (type of nozzle used) mounted in order. Note that, the type of nozzle used is set to a suction nozzle with a large nozzle diameter from within the type of suction nozzle that does not interfere with the adjacent mounted component and is capable of sucking the component.

Next, the CPU 81 of the mounting management device 80 distributes the mounting sequence to each component mounting apparatus 10 (step S300). Specifically, the CPU 81 distributes the number of mounting sequences that are distributed to each component mounting apparatus 10 such that the number is equal or as equal as possible. Each mounting sequence determines which tape feeder component is to be mounted. Therefore, it is determined how many tape feeders 40 are installed on each component mounting apparatus 10 according to the distribution of the mounting sequence.

Next, the CPU 81 of the mounting management device 80 calculates the mounting order of the components in each component mounting apparatus 10 (step S400). At this time, for example, the CPU 81 calculates the mounting order such that the mounting of the component is not hindered by the component that is mounted in advance when the component is mounted on the board.

Next, the CPU 81 of the mounting management device 80 performs the installation position setting routine that determines an appropriate installation position of the tape feeder 40 based on the mounting order of the component (step S500). Details of the routine will be described later.

Next, the CPU 81 of the mounting management device 80 determines whether an installable flag is on or off after performing the installation position setting routine (step S600). The installable flag is a flag that is set to on in a case where the installation position of all of the tape feeders 40 that are currently used is determined and is set to off in other cases. If the installed flag is off in step S600, returning to step S300, the CPU 81 redistributes the mounting sequence to each component mounting apparatus 10, and then performs the processes after step S400. There is a possibility that the installable flag is set from off to on after the installation position setting routine is performed by redistributing such a mounting sequence. If the installed flag is on in step S600, since the installation positions of all tape feeders 40 that are currently used are determined, the CPU 81 stores the production program that includes the installation position in the HDD 83 (step S700) and ends the routine.

Figure 10:
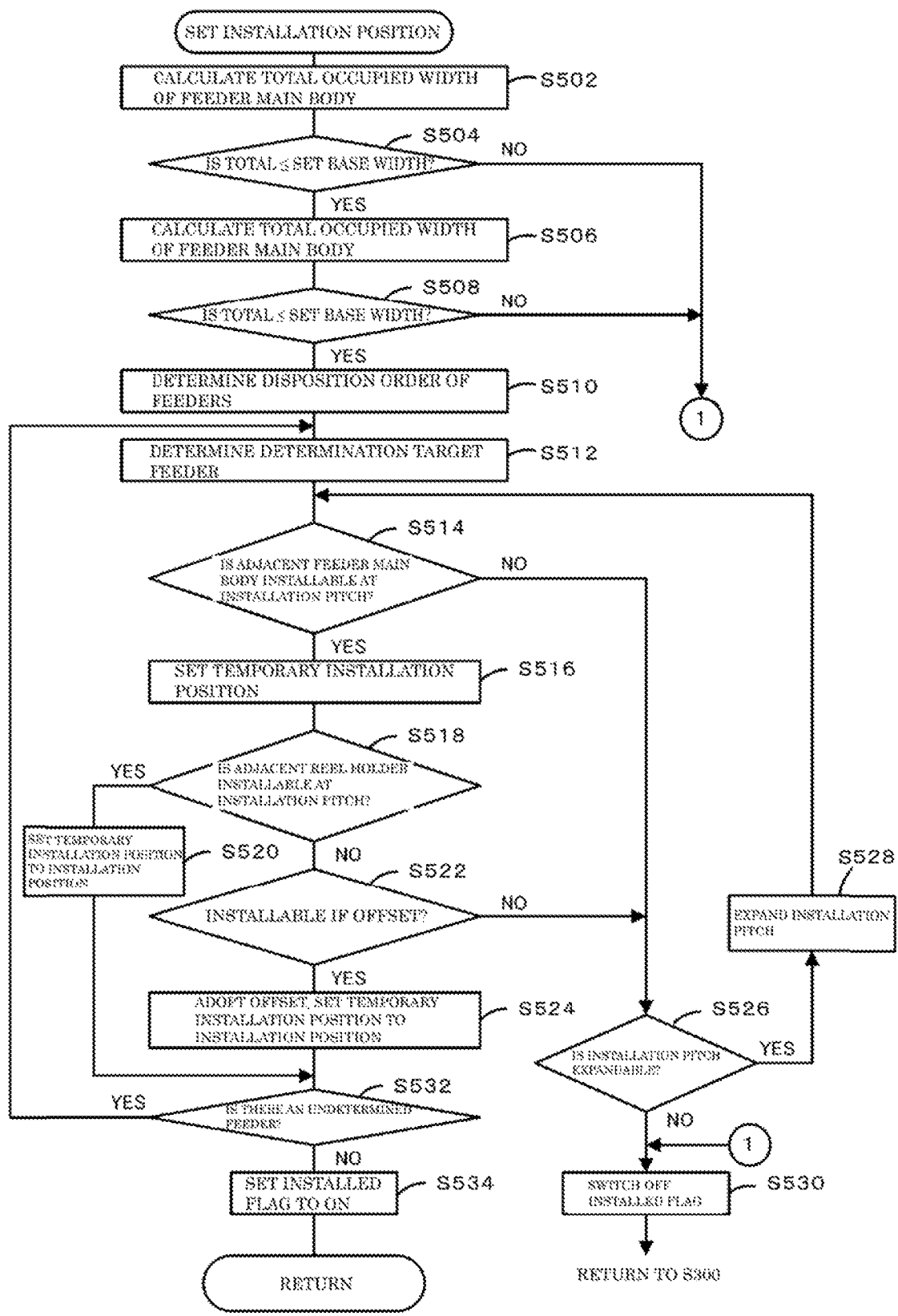
FIG. 10 is a flowchart of an installation position setting routine.

Here, the installation position setting routine (step S500) will be described using the flowchart in FIG. 10. Note that, here, the routine is described in which the installation position of the tape feeder 40 that is distributed to one component mounting apparatus 10 is set, but in practice, all component mounting apparatuses 10 that constitute the component mounting system 1 perform the routine.

When the installation position setting routine is started, the CPU 81 of the mounting management device 80 calculates the total width (occupied width) of the feeder main body 46 of the tape feeder 40 that is distributed to the component mounting apparatus 10 (step S502), and determines whether or not the total fits the width of the feeder setting base 60 (step S504). If the total fits the width of the feeder setting base 60, the CPU 81 calculates the total width (occupied width) of the reel holder 41 of the tape feeder 40 that is distributed to the component mounting apparatus 10 (step 3506), and determines whether or not the total fits the width of the feeder setting base 60 (step S508). If the total fits the width of the feeder setting base 60, the process proceeds to step 3510. Meanwhile, if negative determination is made in step S504 or step S508, since it is not physically possible to install the tape feeder 40 that is distributed to the component mounting apparatus 10 on the feeder setting base

60, the CPU 81 sets the installed flag to off (step S530), and ends the routine. After that, the process proceeds to step S600 of the optimization process described above.

If an affirmative determination is made in step S508, the CPU of the mounting management device 80 determines the disposition order of the tape feeder 40 (step S510). The suction nozzle 38 sucks the component at the component suction position of the tape feeder 40 and then carries the component to a predetermined position of the board S by passing through above the parts camera 39. In a case where the many of the same components are mounted on the board S, when the tape feeder 40 that supplies the component is installed in the slot 62 close to the parts camera 39, a total movement distance of the suction nozzle 38 is shortened, and thus, the mounting time is shortened. Therefore, the CPU 81 determines the disposition order of the tape feeder 40 so as to be installed in the slot 62 close to the parts camera 39 the larger the number of components that are mounted on the board S. The earlier part of the disposition order is disposed in the slot 62 close to the parts camera 39.

Figure 11:
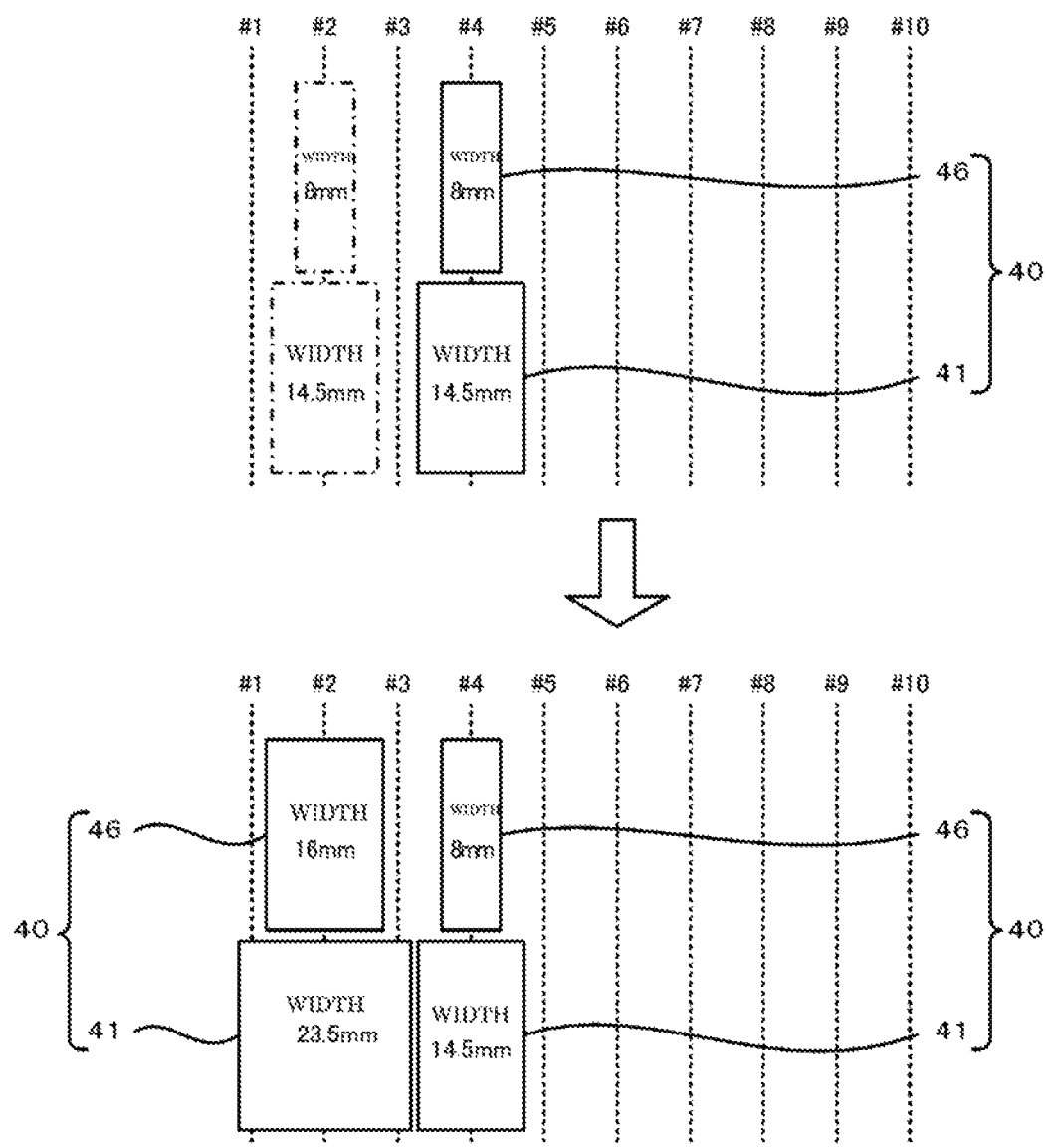
FIG. 11 is an explanatory diagram illustrating an example of when two tape feeders 40 are installed lined up.
Figure 12:
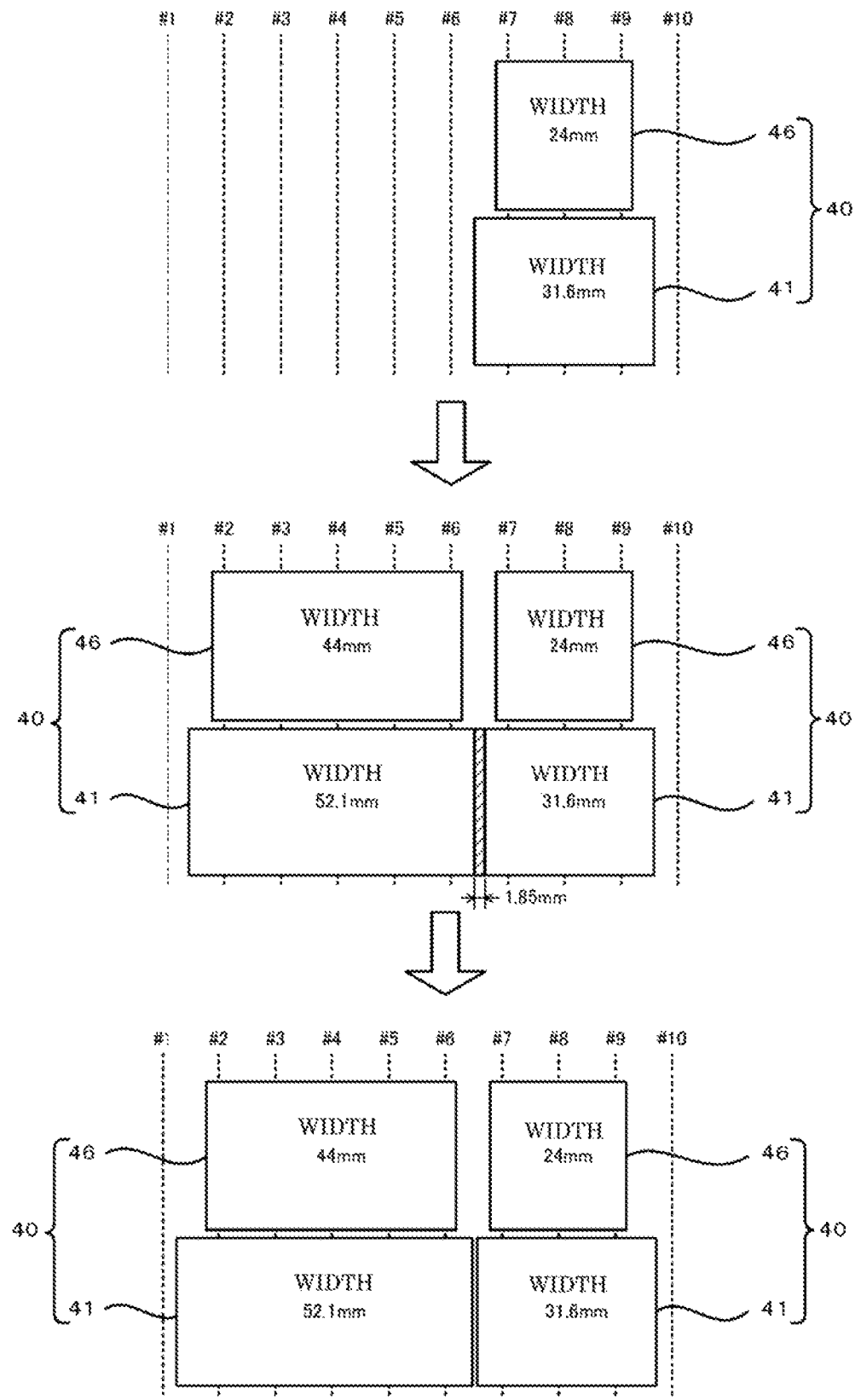
FIG. 12 is an explanatory diagram illustrating an example of when two tape feeders 40 are installed lined up.

Next, the CPU 81 of the mounting management device 80 determines the tape feeder 40 of a determination target that sets the installation position (step S512). The CPU 81 determines the order from the early part of the disposition order of the tape feeders 40 in the determination target. Next, the CPU 81 determines whether or not it is possible to install the feeder main body 46 of the tape feeder 40 that is adjacent to the feeder main body 46 of the tape feeder 40 at an installation pitch (step S514). For example, as shown in the upper part of FIG. 11, a case is considered where the tape feeder 40 with a width of the feeder main body 46 of 8 mm and a width of the reel holder 41 is 14.5 mm is already installed in #4 slot and the tape feeder 40 (determination target) with a width of the feeder main body 46 of 16 mm and a width of the reel holder 41 of 23.6 mm is installed on the left side. In this case, the total occupied width of both feeder main bodies 46 is 8 mm+16 mm=24 mm, and a rounded up value 20 mm is an installation pitch at a slot pitch of the total divided by two (10 mm). As shown in the lower part of FIG. 11, when considering the installation pitch, since it is possible to install the feeder main body 46 of the determination target tape feeder 40 in #2 slot, an affirmative determination is made in step S514. Meanwhile, in the upper part of FIG. 11, in a case where the tape feeder 40 with a width of the feeder main body 46 of 8 mm and a width of the reel holder 41 is 14.5 mm is installed, not in #4 slot, but in #2 slot (refer to one dot chain line), since there is no slot present that has an installation pitch of 20 mm even if the tape feeder 40 (determination target) with a width of the feeder main body 46 of 16 mm and a width of the reel holder 41 of 23.6 mm is installed on the left side, a negative determination is made in step S514. In addition, as shown in the upper part of FIG. 12, in a state in which the tape feeder 40 with a width of the feeder main body 46 of 24 mm and a width of the reel holder 41 of 31.6 mm is already installed in #8 slot, when the tape feeder 40 (determination target) with a width of the feeder main body 46 of 44 mm and a width of the reel holder 41 of 52.1 mm is installed on the left side, the total occupied width of both feeder main bodies 46 is 44 mm+24 mm=68 mm, and a rounded up value 40 mm is an installation pitch at a slot pitch of the total divided by two (10 mm). In this case, as shown in the middle part of FIG. 12, since it is possible to install the feeder main body 46 of the determination target tape feeder 40 in #4 slot, an affirmative determination is made in step S514.

If an affirmative determination is made in step S514, the CPU 81 of the mounting management device 80 sets the slot position of the determination target tape feeder 40 to the temporary installation position (step S516). Next, the CPU 81 determines whether or not it is possible to install the reel holder 41 of the tape feeder 40 that is adjacent to the reel holder 41 of the tape feeder 40 at the temporary installation position at an installation pitch (step 3518). For example, in the lower part in FIG. 11, since the total occupied width of both reel holders 41 is 14.5 mm+23.5 mm=38.0 mm, and the value 19.0 mm of the total divided by two fits the installation pitch 20 mm, an affirmative determination is made in step S518. In the middle part in FIG. 12, since the total occupied width of both reel holders 41 is 52.1 mm+31.6 mm=83.7 mm, and the value 41.85 mm of the total divided by two does not fit the installation pitch 40 mm, a negative determination is made in step S518.

If an affirmative determination is made in step S518, the CPU 81 sets the temporary installation position to the installation position of the tape feeder 40 that is the current determination target (step S520). Meanwhile, if a negative determination is made in step S518, the CPU 81 determines whether or not it is possible to install if offset (step S522). In the middle part in FIG. 12, as described above, the value 41.85 mm of the total occupied width of both reel holders 41 divided by two does not fit the installation pitch 40 mm, but as shown in the lower part in FIG. 12, both reel holders 41 of 41.85 mm−40 mm=1.85 mm are installable if offset in the left-right direction. Here, when a maximum offset amount that is calculated based on the movable range of both reel holders 41 is 2 mm, since 1.85 mm is the maximum offset amount or less, installable is determined in step S522. Meanwhile, when the maximum offset amount of both reel holders 41 is 1.5 mm, since 1.85 mm exceeds the maximum offset amount, uninstallable is determined in step S522.

If an affirmative determination is made in step S522, the CPU 81 of the mounting management device 80 stores the current offset amount and sets the temporary installation position to the installation position of the tape feeder 40 that is the current determination target (step S524). The offset amount is utilized when uninstallable is determined for the determination target tape feeder 40 of the subsequent time.

If a negative determination is made in step S514 or step S522, the CPU 81 of the mounting management device 80 determines whether or not the installation pitch is spread at a one slot pitch (step S526), if possible, the installation pitch is spread at a one slot pitch (step S528), and thereafter, performs the processes of step S514 and after. Meanwhile, if it is not possible to spread the installation pitch at a one slot pitch, the CPU 81 switches off the installed flag (step S530), and the process returns to step S300. For example, in FIG. 12, uninstallable is determined at the installation pitch 40 mm, but the installation pitch spread at a one slot pitch is set to 50 mm in a case where it is not possible to install even if offset at the installation pitch 40 mm. In this case, the determination target tape feeder 40 is inserted in #3 slot, but since there is no particular obstacle, an affirmative determination is made in step S526. Meanwhile, when the installation pitch is spread out, a negative determination is made in step S526 in a case where there is insertion into a slot in which there is nothing present.

When the processes of step S520 or step S524 are performed, the CPU 81 of the mounting management device 80 determines whether or not an undetermined tape feeder 40 remains (step S532), and if an undetermined tape feeder 40 remains, proceeds to step S512 and determines the subsequent determination target tape feeder 40 based on the disposition order, and performs the processes of step S514 and after. Meanwhile, if no undetermined tape feeder 40 remains in step S532, the CPU 81 sets the installed flag to on (step 3534), and ends the routine. When the routine ends, the process proceeds to step S600 of the optimization process described above.

Figure 13:
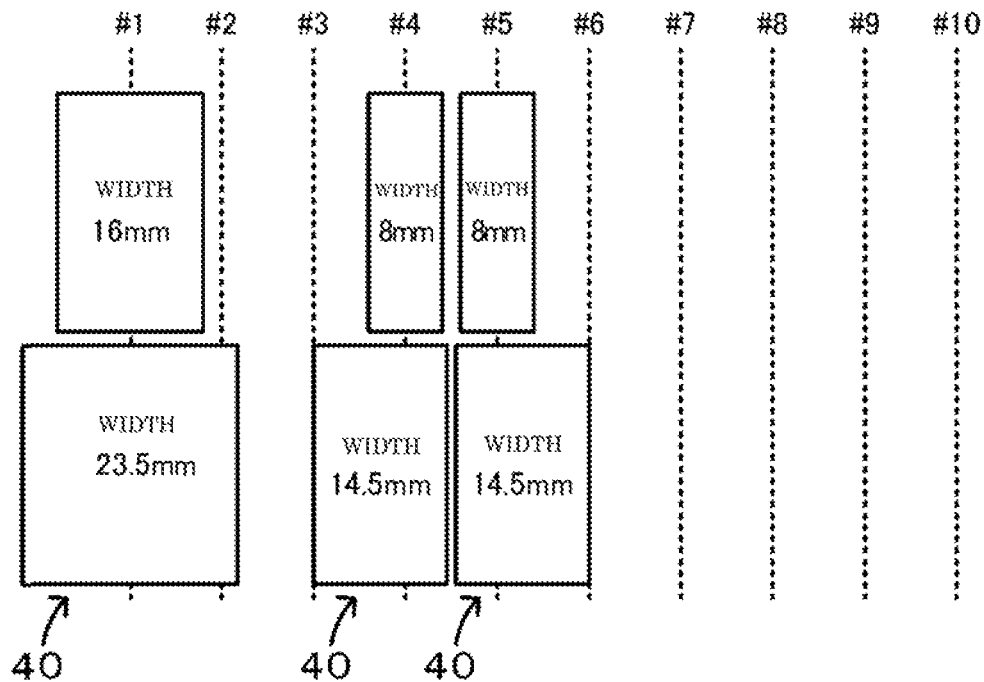
FIG. 13 is an explanatory diagram illustrating an installation example of the tape feeder 40 after the optimization process routine has ended.
Figure 14:
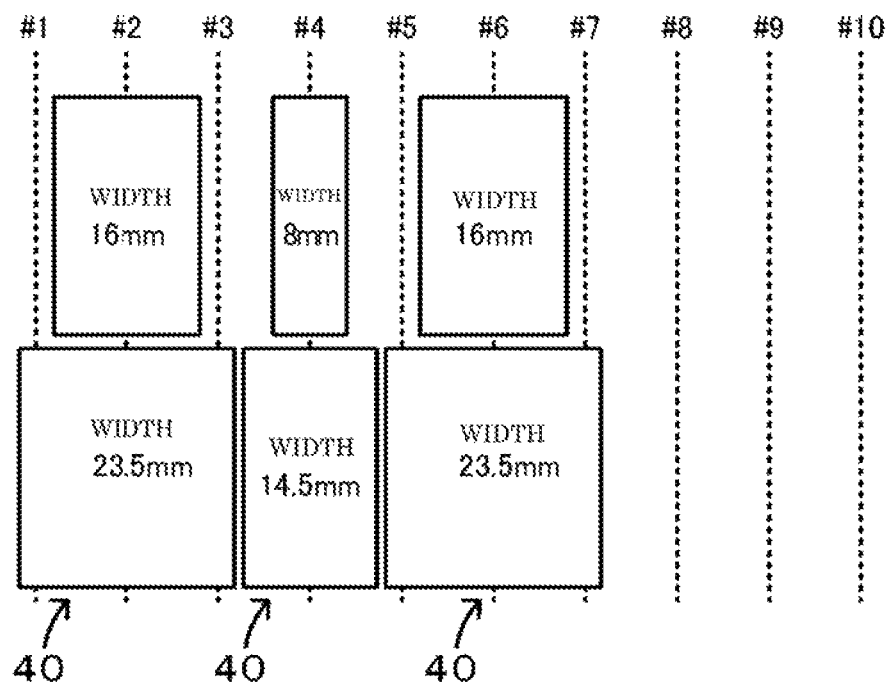
FIG. 14 is an explanatory diagram illustrating an installation example of the tape feeder 40 after the optimization process routine has ended.
Figure 15:
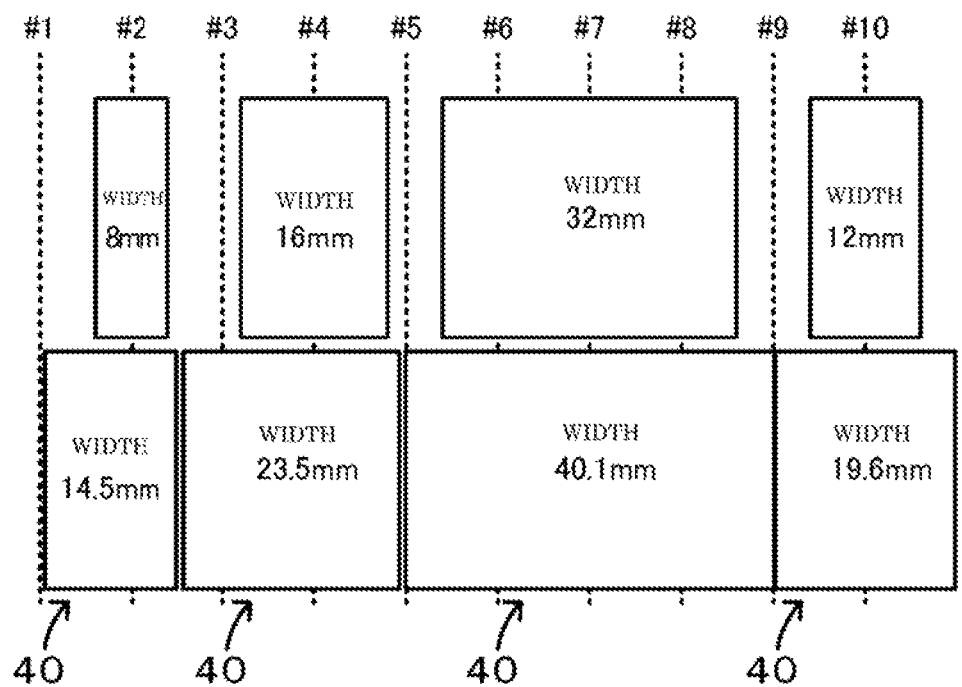
FIG. 15 is an explanatory diagram illustrating an installation example of the tape feeder 40 after the optimization process routine has ended.

When the optimization process routine that includes such an installation position setting routine ends, for example, the tape feeder 40 as shown in FIGS. 13 to 15 is installed on the feeder setting base 60. In FIG. 13, two right tape feeders 40 out of three are displaced. In FIG. 14, none of the three tape feeders 40 are displaced. In FIG. 15, two right tape feeders 40 are not displaced, and two left tape feeders 40 are displaced. Note that, the configurations are examples, and it is possible to install a tape feeder 40 using various other patterns.

According to the mounting management device 80 of the present embodiment that is described above, since the installation position is set considering an amount of displacement of the tape feeder 40 such that the adjacent tape feeders 40 do not interfere with each other, it is possible to avoid interference by considering the displacement amount even in a case where tape feeders 40 and an adjacent tape feeder 40 interfere, if for example, the displacement amount is considered. Accordingly, it is possible to appropriately set in what manner the multiple tape feeders 40 are installed in the slot 62 of the feeder setting base 60 and thus, it is possible to increase the number of tape feeders 40 that are installed on the feeder setting base 60.

In addition, in the installation position setting routine described above, in a state where the temporary installation position is set such that the feeder main bodies 46 of the adjacent tape feeders 40 do not interfere with each other, it is determined whether or not the reel holders 41 interfere with each other without displacement, the temporary installation position is set as the installation position if there is no interference, it is determined whether or not it is possible to avoid interference by displacing the reel holder 41 of the tape feeder 40 if there is interference by setting the displacement amount as an upper limit, if it is possible to avoid interference, the temporary installation position is set as the installation position, and if it is not possible to avoid interference, the temporary installation position of each tape feeder 40 is updated such that a gap between both positions is wide. Therefore, it is possible, as appropriate, to comparatively easily perform setting of the installation position.

Furthermore, in the installation position setting routine described above, the initial temporary installation position is set such that a rounded up value at a slot pitch at which the total occupied width of adjacent feeder main bodies 46 is divided by two as the installation pitch, and at the installation pitch, the adjacent feeder main bodies 46 do not interfere with each other. The installation pitch is set such that the adjacent feeder main bodies 46 are closest to each other. Therefore, it is possible to set the width (entire width) that all tape feeders 40 on the feeder setting base 60 occupy as narrow as possible.

Furthermore, in the installation position setting routine described above, reinstallation is attempted by increasing the installation pitch at a one slot pitch in a case where the adjacent reel holders 41 interfere with each other at a minimum installation pitch considering the displacement amount. That is, in a case where the adjacent tape feeders 40 are not able to be installed at the minimum installation pitch, installation is attempted at a subsequent small installation pitch. Therefore, it is possible to set the width (entire width) that all tape feeders 40 on the feeder setting base 60 occupy as narrow as possible. Additionally, if it is not possible to increase the installation pitch in the configuration of the feeder setting base 60, the mounting sequence of the component mounting apparatus 10 is redistributed. Thereby, it is likely that it is possible to install after modifying since the number and/or combination of the tape feeders 40 that are set to be installed on the feeder setting base 60 is modified.

Note that, needless to say, the present disclosure is not limited to the embodiments described above, and it is possible to perform various forms within the technical scope of the present disclosure.

For example, in the installation position setting routine of the embodiment described above, when the installation position is set, the clearance between the reel holders 41 of the adjacent tape feeders 40 may be as narrow as possible. Specifically, in the installation position setting routine, directly prior to the installed flag being set to on in step S534, a proportion that a total value of a clearance between the reel holders 41 of the adjacent tape feeders 40 occupies the width of the feeder setting base 60 is calculated, it is determined whether or not the proportion exceeds a predetermined proportion, the process proceeds to step S534 if the proportion is not exceeded, and the process proceeds to step S530 if the proportion is exceeded and the installed flag may be set to off. By doing so, in a case where clearance is wide, it is anticipated that the clearance between the reel holders 41 of the adjacent tape feeders 40 is narrowed after modifying, since the number or combination of the tape feeders 40 that are set to be installed on the feeder setting base 60 is modified. As a result, by doing so, it is possible to increase the number of installed tape feeders.

In step S502 and step S504 of the installation position setting routine of the embodiment described above, the total occupied width of the feeder main body 46 is calculated, and it is determined whether or not the total exceeds the width of the feeder setting base 60, but these steps may be omitted. In step S506 and step S508, it is determined whether or not the total occupied width of the reel holder 41 that has a wider width than the feeder main body 46 exceeds the width of the feeder setting base 60.

In the embodiment described above, both of the variable tape feeder (tape feeder 40) and a fixed tape feeder (the tape feeder 140 that is fixed by the reel holder 141 to the feeder main body 146) may be used as the tape feeder that is installed in the slot 62 of the feeder setting base 60. Even in this case, the same effects as the embodiment described above are obtained since at least one of the adjacent tape feeders is a tape feeder 40.

In the embodiment described above, an example is given of a reel holder 41 that is displaceable in the width direction with respect to the feeder main body 46 via the link mechanism 50, but is not particularly limited to the link mechanism 50. For example, a slide groove that extends in the width direction may be provided above and below the hole 46a of the feeder main body 46 and the slide groove may be provided above and below the reel holder 41 of a slidable piece.

INDUSTRIAL APPLICABILITY

The present disclosure is able to be utilized in management of a component mounting apparatus which picks up and mounts a component on a board using a nozzle of a component pick-up head from a component supply tape that is fed out to a component supply position.

REFERENCE SIGNS LIST

1: COMPONENT MOUNTING SYSTEM, 10: COMPONENT MOUNTING APPARATUS, 14: COMPONENT

MOUNTING MACHINE, 18: BOARD CONVEYANCE DEVICE, 20: SUPPORTING BOARD, 22: CONVEYOR BELT, 23: SUPPORT PIN, 26: X-AXIS SLIDER, 28: GUIDE RAIL, 30: Y-AXIS SLIDER, 32: GUIDE RAIL, 34: HEAD UNIT, 35: HANDLE, 36: ROTARY HEAD, 38: SUCTION NOZZLE, 39: PARTS CAMERA, 40: TAPE FEEDER, 41: REEL HOLDER, 42: TAPE REEL, 43: REEL HOLDING SHAFT, 44: LOWER COVER, 45: UPPER COVER, 46: FEEDER MAIN BODY, 46*a*: HOLE, 47: SPROCKET, 48: CONTROL BOARD, 49: RAIL, 50: LINK MECHANISM, 51-54: SWING LINK, 55: FRONT MAIN BODY SHAFT, 56: FRONT HOLDER SHAFT, 57: REAR MAIN BODY SHAFT, 58: REAR HOLDER SHAFT, 59: CLAMP MEMBER, 60: FEEDER SETTING BASE, 62: SLOT, 64: CLAMP GROOVE, 65: CONNECTOR, 66: POSITIONING HOLE, 70: MOUNTING CONTROLLER, 75: CONNECTOR, 76: POSITIONING PIN, 80: MOUNTING MANAGEMENT DEVICE, 81: CPU, 82: ROM, 83: HDD, 84: RAM, 85: INPUT DEVICE, 86: DISPLAY, 140: TAPE FEEDER, 141: REEL HOLDER, 146: FEEDER MAIN BODY

The invention claimed is:

1. A mounting management device managing a component mounting apparatus which includes component mounting means for picking up and mounting a component on a board using a nozzle from a component supply tape that is fed out to a component supply position, tape feeders each including a reel holding section that rotatably holds a reel around which the component supply tape is wound and a feeder section that feeds out the component supply tape that is unwound from the reel to the component supply position, and a feeder setting base on which a plurality of slots into which the tape feeders are installable, the mounting management device comprising:

installation position setting means for setting the tape feeders having a same or different width to be installed on the feeder setting base, wherein at least one of the tape feeders is a variable tape feeder in which the reel holding section of the variable tape feeder is displaceable in a tape width direction to a predetermined displacement amount with respect to the feeder section of the variable tape feeder, the reel holding section of the variable tape feeder having a wider width than the feeder section of the variable tape feeder, and the installation position setting means sets an installation position considering an amount of displacement of the variable tape feeder such that the variable tape feeder and adjacent tape feeders do not interfere with each other.

2. The mounting management device according to claim 1, wherein the installation position setting means sets the installation position such that clearance between the reel holding sections of the adjacent tape feeders is a predetermined width.

3. The mounting management device according to claim 1, wherein the installation position setting means determines whether or not there is an interference between the reel holding sections of the variable tape feeder and the adjacent tape feeders without displacement in a state where a temporary installation position is set such that the feeder sections of the variable tape feeder and the adjacent tape feeders do not interfere with each other, if there is no interference, sets the temporary installation position as the installation position, if there is interference, displacing the reel holding section of the variable tape feeder, and if the interference is avoided by the displacing reel holding section of the variable tape feeder, sets the temporary installation position as the installation position.

4. The mounting management device according to claim 3, wherein, initially, the installation position setting means sets the temporary installation position of each of the tape feeders, and sets the feeder sections of the variable tape feeder and the adjacent tape feeders in a range without interfering with each other.

5. The mounting management device according to claim 3, wherein the installation position setting means modifies any number of the tape feeders that are set to be installed on the feeder setting base if there is the interference between the reel holding sections of the variable tape feeder and the adjacent tape feeders.

* * * * *